United States Patent [19]

Ohshima et al.

[11] Patent Number: 5,102,826

[45] Date of Patent: Apr. 7, 1992

[54] METHOD OF MANUFACTURING A SEMICONDUCTOR DEVICE HAVING A SILICIDE LAYER

[75] Inventors: Jiro Ohshima, Kitakyushu; Shin-ichi Taka, Yokosuka; Toshiyo Motozima; Hiroshi Naruse, both of Yokohama, all of Japan

[73] Assignee: Kabushiki Kaisha Toshiba, Kawasaki, Japan

[21] Appl. No.: 610,216

[22] Filed: Nov. 9, 1990

[30] Foreign Application Priority Data

Nov. 10, 1989 [JP] Japan .................................. 1-293491

[51] Int. Cl.$^5$ .................... H01L 21/283; H01L 21/266
[52] U.S. Cl. ........................... 437/200; 437/24; 437/27; 437/190; 437/192; 437/978; 748/DIG. 106
[58] Field of Search ............... 437/41, 200, 192, 193, 437/833, 20, 24, 27; 148/DIG. 147, DIG. 19, DIG. 106

[56] References Cited

U.S. PATENT DOCUMENTS

| | | | |
|---|---|---|---|
| 4,558,507 | 12/1985 | Okabayashi et al. | 437/24 |
| 4,622,735 | 11/1986 | Shibata | 148/DIG. 147 |
| 4,683,645 | 8/1987 | Naguib et al. | 437/41 |

OTHER PUBLICATIONS

Wittmer, M., et al., "Barrier layers: Principles ... ", *J. Vac. Sci. Technol.* A2(2), Apr.–Jun. 1984, pp. 273–279.

*Primary Examiner*—Brian E. Hearn
*Assistant Examiner*—T. N. Quach
*Attorney, Agent, or Firm*—Finnegan, Henderson, Farabow, Garrett and Dunner

[57] ABSTRACT

According to the method of manufacturing a semiconductor device of the present invention, an insulation film is formed on a silicon substrate, and a resist film having a predetermined pattern is formed on the insulation film, followed by forming an opening on the insulation film with the resist film performing as a mask. Then, an impurity having conductivity are implanted into said silicon substrate with the resist film performing as a mask and silicon ions are implanted into the silicon substrate with the resist film performing as a mask. After that, the resist film is removed. Further, a refractory metal film which covers at least the opening is formed. Moveover, a diffusion layer which causes electrical activation of the impurity having conductivity is formed by annealing, followed by formation a silicide layer at where the surfaces of the silicon substrate and the metal film meet.

5 Claims, 1 Drawing Sheet

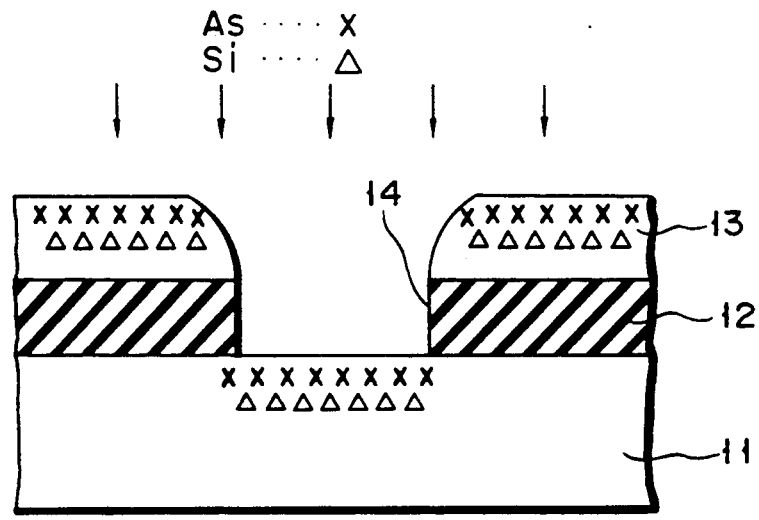
F I G. 1A
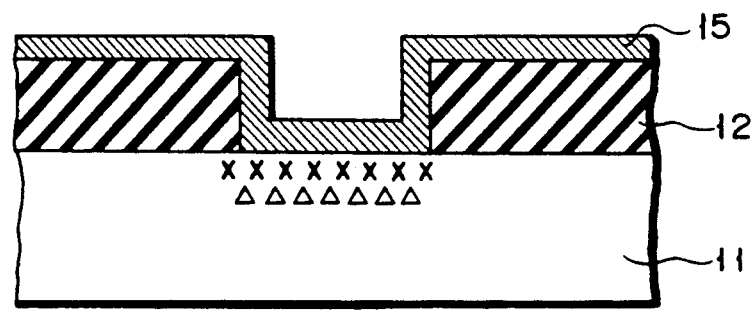
F I G. 1B
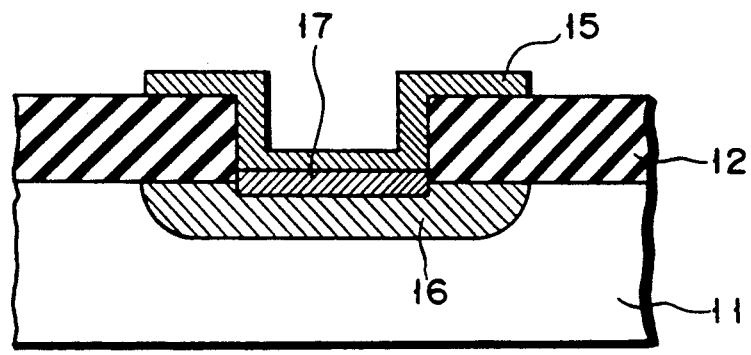
F I G. 1C

METHOD OF MANUFACTURING A SEMICONDUCTOR DEVICE HAVING A SILICIDE LAYER

BACKGROUND OF THE INVENTION

1. Field of the Invention

The present invention relates to a method of manufacturing a semiconductor device, especially one having a (relatively) shallow junction.

2. Description of the Related Art

Conventionally, to manufacture a semiconductor device which has a narrow junction of about 0.2–0.3 μm in its substrate, the method explained below is generally employed.

First, an insulation film such as an oxidation film is formed on a semiconductor substrate, and a resist pattern is formed on the insulation film. Then, the insulation film is processed into a desired pattern, and ions of an impurity such as As (arsenic) are implanted into the semiconductor substrate, with the resist pattern performing as a mask. After a protection film (or the like) is formed, annealing is carried out and the impurities are electrically activated. Then, the resist pattern is and an aluminum alloy film is formed over all of the substrate. This alloy film is patterned, and an electrode is formed which is electrically connected to the shallow function.

However, in the above-mentioned method, activation of the impurities by annealing is carried out after ions are implanted directly to the semiconductor substrate. Therefore, defects result due to the ions remaining in the substrate during the period of recovery from the damage in the substrate which was caused by the ion implantation. As a result, a regional, abnormal diffusion of the implanted atoms is induced, and junction leak and the like are likely to occur.

Further, when an element having a high vapor pressure such as As is ion-implanted, followed by activation by annealing. As atoms diffuse in the outer direction. Thus, the concentration of the impurity cannot be uniformly maintained successfully uniformed.

Further, when the impurity is ion-implanted in a high concentration, some of the implanted atoms precipitate on the surface of the semiconductor substrate in some cases. The precipitation of these implanted atoms impairs the ohmic contact between the semiconductor substrate and the aluminum alloy when forming the electrode at the shallow junction area.

SUMMARY OF THE INVENTION

The object of the present invention is to provide a method of manufacturing a semiconductor device which can achieve uniform electric activation of an ion-implanted area, a stable shape of the surface of a contact portion, and excellent ohmic contact.

In order to achieve this object, the method of manufacturing a semiconductor device according to the present invention comprises the steps of forming an insulation film on a silicon substrate, forming a resist film having a predetermined pattern on the insulation film, forming an opening on the insulation film with the resist film performing as a mask, implanting an impurity having conductivity into said silicon substrate with the resist film performing as a mask, ion-implanting silicon into the silicon substrate with the resist film performing as a mask, removing the resist film, forming a refractory metal film which covers at least the opening, forming a diffusion layer by annealing which causes electrical activation of the impurity having conductivity, and forming a silicide layer where the surfaces of the silicon substrate and the metal film meet.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

Each of FIGS. 1A–1C is a cross-sectional view of a semiconductor device at each stage in an embodiment of method according to the present invention.

DETAILED DESCRIPTION OF THE PREFERRED EMBODIMENT

An embodiment of the present invention will be described in detail with reference to drawings.

FIGS. 1A–1C illustrate the embodiment of the method of manufacturing semiconductor devices, according to the present invention.

First, as is shown in FIG. 1A, an oxidation film 12 is formed on a P-type silicon substrate 11, and a resist pattern 13 is formed on the oxidation film 12 Then, a desired opening 14 is formed on the oxidation film 12 with the resist pattern 13 performing as a mask. After that, As (arsenic) ions, for example, as a high concentration impurity, are implanted into the substrate 11 under the condition of about 50kV and $5 \times 10^{15}$ atoms/cm$^2$, and by using the same mask, Si (silicon) ions are implanted into the substrate 11 under the condition of about 30kV and $7 \times 10^{15}$ atoms/cm$^2$. Consequently, the section where Si ions are implanted, is saturated with Si atoms. In addition, the amount of Si ions implanted should be $1 \times 10^{15}$ atoms/cm$^2$ or more.

Next, as is illustrated in FIG. 1B, the resist pattern 13 is removed, and a refractory metal film 15 (for example, TiW film) having the thickness of about 100nm as a surface protection film is formed on the substrate 11 which includes the opening 14 by a sputtering method. In fact, the refractory metal film 15 can be formed having any thickness in the range with which a silicide layer can be formed, and actually, the thickness of 50 nm is enough.

After that, as is illustrated in FIG. 1C, annealing is carried out in an N$_2$ (nitrogen gas) atmosphere at about 950° C. for about 60 minutes. In this annealing step, silicidization of the refractory metal film 15 and the Si atoms is proceeded, and the As atoms are electrically activated. Thus, an As diffusion layer 16 is formed, and a silicide layer 17 is formed where the surfaces of the refractory metal film 15 and the As diffusion layer 16 meet. Then, patterning is carried out for the refractory metal film 15, and an electrode is formed.

According to this manufacturing method, during activation of the As atoms, since a silicide reaction and a self-diffusion of the Si atoms implanted occur at the same time where the metal film 15 and the As diffusion layer 16 meet, a relatively shallow As diffusion layer 16 having a high and uniform concentration can be formed. Further, the substrate is saturated with Si atoms, and therefore consumption of Si which constitutes the substrate can be suppressed as much as possible. Consequently, it is possible to stabilize the shape of the silicide layer 17 formed at where the metal film 15 and the diffusion layer 16 meet. Regarding the problem of precipitation of As atoms in the conventional solved in the silicide layer 17 in the form of solid solution. Thus, precipitation which is electrically inactive does not occur and the ohmic contact can be easily obtained. Moreover, regarding the structure of electrode, the refractory metal film 15, as it is, can serve as the opening 14. In other words, an electrode can be made by a self-align mode, and the size of the semiconductor device can be made small.

The following is an explanation of a case where the present invention is applied to an NPN-type bipolar transistor. In this application, a high concentration emitter region of the bipolar transistor plays a role of the As diffusion layer 16. The production possibility of the bipolar transistor was examined. The result shows the production possibility of a transistor having an emitter size of 6×6 μm was 99.991%, which is better than 99.98% in the case of the conventional production method.

In the above-mentioned embodiment, As atoms are used as impurity atoms for forming a relatively shallow diffusion layer; however the present invention is not limited to this embodiment, but for example, two or more types of impurity atoms can be ion-implanted. Further, according to the present invention, double diffusion and triple diffusion areas can be obtained. More specifically, these double diffusion and triple diffusion areas can be formed by forming an opening on the diffusion layer formed in a silicon substrate in advance. Some of the examples of the material which constitutes the refractory metal film, other than TiW are Ti, W, Mo, MoSi, WSi, TiSi, and the material of a can be used if it is resistive to heat in the annealing step which follows later.

Lastly, the above-mentioned embodiment is directed to a semiconductor device having an N-type diffusion layer; however, of course, the present invention can be applied to a semiconductor device having a P-type diffusion layer.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising steps of:
    forming an insulation film on a silicon substrate;
    forming a resist film on said insulation film;
    patterning said resist film;
    etching said insulation film using said resist film as a mask to produce a contact hole in said insulation film;
    implanting impurities into said silicon substrate using said resist film as a mask;
    implanting silicon ions into said silicon substrate using said resist film as a mask;
    removing said resist film;
    forming a refractory metal film on an exposed surface of said silicon substrate within said contact hole;
    forming a diffusion layer by annealing to cause electrical activation of the impurities, and forming a silicide layer at surfaces where the silicon substrate and the metal film meet; and
    patterning said refractory metal film to form an electrode.

2. A method of manufacturing a semiconductor device according to claim 1, wherein an amount of said silicon ions is $1 \times 10^{15}$ atoms/cm$^2$ or more.

3. A method of manufacturing a semiconductor device according to claim 1, wherein said impurities are 4. A method of manufacturing a semiconductor device according to claim 1, wherein said refractory metal film has a thickness of about 100 nm.

5. A method of manufacturing a semiconductor device according to claim 1, wherein said refractory metal film is a material selected from the group consisting of TiW, Ti, W, Mo, MoSi, WSi, TiSi, TiN, and a deposition layer of TiN and Ti.

* * * * *

UNITED STATES PATENT AND TRADEMARK OFFICE
CERTIFICATE OF CORRECTION

PATENT NO. : 5,102,826
DATED : April 07, 1992
INVENTOR(S) : Jiro Ohshima et al

It is certified that error appears in the above-identified patent and that said Letters Patent is hereby corrected as shown below:

Title page, item [57]
Abstract, line 13, change "Moveover" to --Moreover--.
Title page, item [57]
Abstract, lines 15 and 16, change "formation a silicide layer at where" to --formation of a silicide layer where--.

Claim 3, column 4, line 37, after "are" insert
--As ions.--.

Signed and Sealed this

Nineteenth Day of October, 1993

BRUCE LEHMAN

Attest:

Attesting Officer

Commissioner of Patents and Trademarks